United States Patent
Yamasaki et al.

(10) Patent No.: US 7,910,498 B2
(45) Date of Patent: Mar. 22, 2011

(54) METHOD FOR MANUFACTURING SEMICONDUCTOR DEVICE

(75) Inventors: Yasuo Yamasaki, Shiojiri (JP); Shuichi Tanaka, Chino (JP); Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 455 days.

(21) Appl. No.: 11/425,826

(22) Filed: Jun. 22, 2006

(65) Prior Publication Data

US 2007/0026660 A1 Feb. 1, 2007

(30) Foreign Application Priority Data

Jul. 12, 2005 (JP) .................................. 2005-203487

(51) Int. Cl.
*H01L 21/31* (2006.01)

(52) U.S. Cl. ........................ 438/781; 438/597; 438/612

(58) Field of Classification Search .................. 438/597, 438/612, 781
See application file for complete search history.

(56) References Cited

U.S. PATENT DOCUMENTS

| 6,914,331 | B2 * | 7/2005 | Shimoishizaka et al. ..... 257/724 |
| 7,122,896 | B2 | 10/2006 | Saito et al. |
| 2002/0017730 | A1 * | 2/2002 | Tahara et al. ................ 257/786 |
| 2003/0054659 | A1 * | 3/2003 | Igarashi et al. ............... 438/720 |
| 2003/0218247 | A1 * | 11/2003 | Shimoishizaka et al. ..... 257/734 |

FOREIGN PATENT DOCUMENTS

| JP | 60247947 A * | 12/1985 |
| JP | A 02-272737 | 11/1990 |
| JP | A-2004-039863 | 2/2004 |
| JP | A-2005-101527 | 4/2005 |
| JP | A-2005-123268 | 5/2005 |
| JP | A-2005-136402 | 5/2005 |

* cited by examiner

*Primary Examiner* — David Vu
*Assistant Examiner* — Brandon Fox
(74) *Attorney, Agent, or Firm* — Oliff & Berridge, PLC

(57) ABSTRACT

A method for manufacturing a semiconductor device, including: (a) forming an energy cured resin layer on a semiconductor substrate having an electrode pad and a passivation film; (b) fusing the resin layer without being cured and shrunk by a first energy supply processing; (c) forming a resin boss by curing and shrinking the resin layer after fusion by a second energy supply processing; and
(d) forming an electrical conducting layer which is electrically connected to the electrode pad and passes through over the resin boss.

6 Claims, 4 Drawing Sheets

METHOD FOR MANUFACTURING SEMICONDUCTOR DEVICE

The entire disclosure of Japanese Patent Application No. 2005-203487, filed Jul. 12, 2005 is expressly incorporated by reference herein.

BACKGROUND OF THE INVENTION

1. Technical Field

The present invention relates to a method for manufacturing a semiconductor device.

2. Related Art

In order to improve electrical connection reliability, semiconductor devices using a resin core bump in which an electrical conducting layer is formed on a resin boss as an external terminal have been developed. According to such a semiconductor device, after the resin boss is formed on a semiconductor substrate, the electrical conducting layer is formed over from an electrode pad to the resin boss. In general, in a step of forming the electrical conducting layer, Ar contra-sputtering is performed to remove an oxide layer on the electrode pad. However, performing Ar contra-sputtering may lead to carbonization of the surface of the resin boss. In result, insulating resistance of the resin may be decreased, which might cause migration. In addition, in the case of the foregoing structure, the electrical conducting layer is formed to pass through over the three dimensional resin boss. Therefore, it is demanded to prevent the electrical conducting layer from being exfoliated or disconnected.

JP-A-2-272737 is an example of related art.

SUMMARY

An advantage of some aspects of the invention is to improve contact characteristics of an electrical conducting layer and prevent migration.

A method for manufacturing a semiconductor device according to a first aspect of the invention includes: a. a step of forming an energy cured resin layer on a semiconductor substrate having an electrode pad and a passivation film; b. a step of fusing the resin layer without being cured and shrunk by a first energy supply processing; c. a step of forming a resin boss by curing and shrinking the resin layer after fusion by a second energy supply processing; and d. a step of forming an electrical conducting layer which is electrically connected to the electrode pad and passes through over the resin boss.

According to the first aspect of the invention, the resin layer is fused, the surface is formed into a smooth curved surface, and the resin layer is cured and shrunk from such a shape. Therefore, a resin boss with a moderate rising section can be finally formed. Thereby, the electrical conducting layer is prevented from being exfoliated and disconnected, and the contact characteristics thereof can be improved.

According to the first aspect of the invention, a state that B is provided on specific A includes the case that B is directly provided on A and the case that other element is sandwiched between A and B. The same is applied to the following aspect of the invention.

A method for manufacturing a semiconductor device according to a second aspect of the invention includes: a. a step of forming an energy cured resin layer on a semiconductor substrate having an electrode pad and a passivation film b. a step of fusing the resin layer so that fusion of a surface section is progressed more than of a central section by a first energy supply processing; c. a step of forming a resin boss by curing and shrinking the resin layer by a second energy supply processing; and d. a step of forming an electrical conducting layer which is electrically connected to the electrode pad and passes through over the resin boss.

According to the second aspect of the invention, the surface section of the resin layer is fused, the surface is formed into a smooth curved surface, and the resin layer is cured and shrunk from such a shape. Therefore, a resin boss with a moderate rising section can be finally formed. Thereby, the electrical conducting layer is prevented from being exfoliated and disconnected, and the contact characteristics thereof can be improved.

3. In the method for manufacturing a semiconductor device according to the second aspect of the invention, the resin layer other than the central section, that is, only the surface section may be fused in the step b.

4. In the method for manufacturing a semiconductor device according to the first aspect of the invention, both the first and the second energy supply processing may be heat processing, and the heating temperature in the step c may be higher than the heating temperature in the step b.

5. In the method for manufacturing a semiconductor device according to the first aspect of the invention, the resin layer may be formed in the shape of an approximate quadrangle on cross section by the step a, and the resin layer may be formed in the shape of an approximate semicircle on cross section by the step b.

6. In the method for manufacturing a semiconductor device according to the first aspect of the invention, in the step d, an oxide film may be removed from the surface of the electrode pad and carbonization of the surface of the resin boss may be progressed by Ar gas before forming the electrical conducting layer, and the resin boss may be partly removed by using the electrical conducting layer as a mask after forming the electrical conducting layer.

Thereby, even if carbonation of the resin boss is progressed by Ar gas and a carbonized layer (or plasma polymerization layer) is formed, the resin boss can be easily removed without leaving the carbonized layer or the like since the rising section of the resin boss is formed moderately. In particular, the carbonized layer or the like easily remains in the root section of the resin boss. However, according to the aspect of the invention, the carbonized layer or the like remaining in the root section of the resin boss can be easily removed.

BRIEF DESCRIPTION OF THE DRAWINGS

The invention will be described with reference to the accompanying drawings, wherein like numbers reference like elements.

DESCRIPTION OF EXEMPLARY EMBODIMENT

An embodiment of the invention will be described with reference to the drawings.

Method for manufacturing a semiconductor device FIG. 1 to FIG. 11 are drawings for explaining a method for manufacturing a semiconductor device according to the embodiment of the invention.

Figure 1:
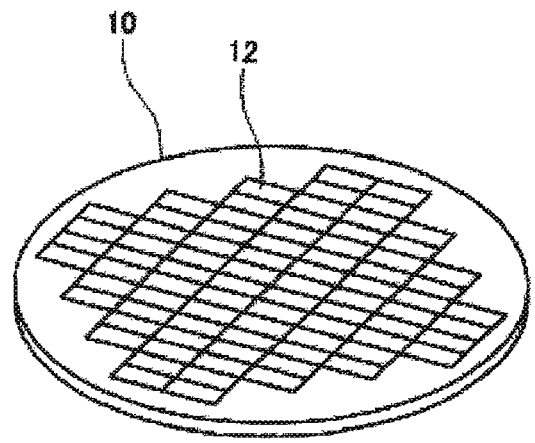
FIG. 1 is a view explaining a method for manufacturing a semiconductor device according to this embodiment.
Figure 2:
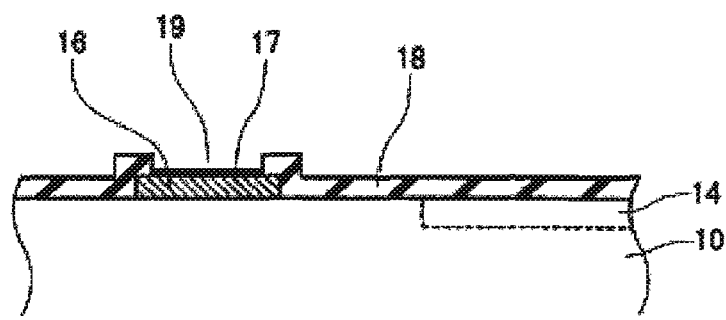
FIG. 2 is a view explaining the method for manufacturing a semiconductor device according to this embodiment.

1. First, as shown in FIG. 1 and FIG. 2, a semiconductor substrate 10 is prepared. The semiconductor substrate 10 is, for example, a semiconductor wafer (refer to FIG. 1). In this case, the semiconductor substrate 10 has a plurality of chip regions 12 to become semiconductor chips. An integrated circuit 14 is formed inside each chip region 12. That is, when the semiconductor substrate 10 is divided into the plurality of semiconductor chips, each semiconductor chip has each integrated circuit 14. The integrated circuit 14 includes at least active devices such as a transistor. The chip region 12 is in the shape of an orthogon (for example, rectangle) in the plan view. In each chip region 12, a plurality of electrode pads (for example, aluminum pad) 16 are formed. The plurality of electrode pads 16 may be arranged along opposed two sides of the chip region 12 (for example, two long sides) or four sides of the chip region 12. In this case, one or a plurality of rows of the electrode pads 16 are arranged in each side. When the electrode pads 16 are arranged in the edge of the chip region 12, the integrated circuit 14 may be formed in the central section surrounded by the plurality of electrode pads 16. Otherwise, the electrode pad 16 may be formed in the region overlapped with the integrated circuit 14 in the plan view. The electrode pad 16 is electrically connected to the integrated circuit 14 through an internal wiring (not shown).

A passivation film (protective film) 18 is formed on the surface of the semiconductor substrate 10 (face on which the integrated circuit 14 is formed). The passivation film 18 may be formed either from an inorganic material or an organic material. For example, the passivation film 18 may be formed from at least one layer of a silicon oxide film and a silicon nitride film. An aperture 19 is formed in the passivation film 18 to provide the electrode pad 16 with opening. At least part of the electrode pad 16 (for example, only the central section) is exposed by the aperture 19. In many cases, an oxide layer 17 is formed on the electrode pad 16. The oxide layer 17 is formed by, for example, natural oxidation, and coats the surface of the electrode pad 16.

Figure 4:
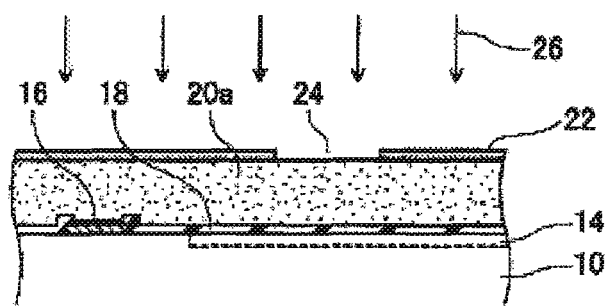
FIG. 4 is a view explaining the method for manufacturing a semiconductor device according to this embodiment.
Figure 5:
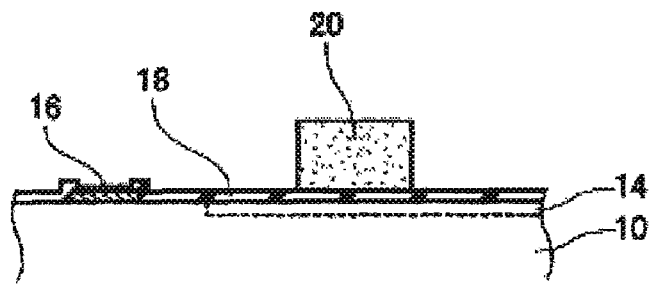
FIGS. 5 is a view explaining the method for manufacturing a semiconductor device according to this embodiment.

2. Next, as shown in FIG. 3 to FIG. 5, a resin layer 20 is formed.

The resin layer 20 can be formed on the semiconductor substrate 10 (more particularly on the passivation film 18) and in a region different from the electrode pad 16 in the plan view. The region where the resin layer 20 is formed is not limited, but for example, the resin layer 20 can be formed in the shape of a straight line having a given width. In this case, the resin layer 20 can be formed to extend along (for example, in parallel to) a boundary of the chip region 12 of the semiconductor substrate 10 (for example, in the long side direction).

Figure 3:
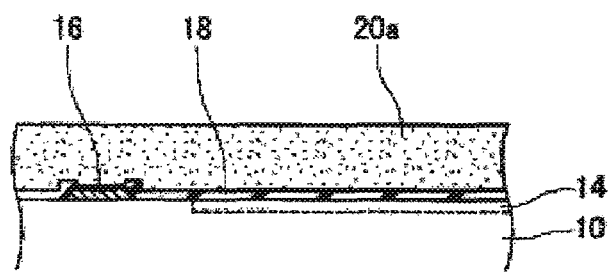
FIG. 3 is a view explaining the method for manufacturing a semiconductor device according to this embodiment.

Specifically, first, as shown in FIG. 3, the semiconductor substrate 10 is coated with a photosensitive resin layer 20a by, for example, spin coat method. After that, as shown in FIG. 4, a mask 22 having an aperture 24 is arranged over the semiconductor substrate 10. Then, exposure is made by illuminating with light energy 26. When a negative type resin layer 20a in which solubility of a developing solution is decreased in the section illuminated with the light energy 26 is used, the resin can remain only in the region exposed from the aperture 24 of the mask 92. On the contrary, when a positive type resin layer 20a in which solubility of a developing solution is increased in the section illuminated with the light energy 26 is used, the resin can remain only in the region covered with the mask 22. After that, by performing an image development step, as shown in FIG. 5, the resin layer 20 can be patterned in a given shape. The resin layer 20 can be formed in the shape of an approximate quadrangle (approximate orthogon) on cross section.

Here, as an example of a resin material of the resin layer 20, an elastic resin material such as a polyimide resin, an acrylic resin, a phenol resin, an epoxy resin, a silicon resin, and a modified polyimide resin can be cited. Further, the resin layer 20 can be, for example, polyimide, polybenzoxazole, benzocyclobutene, epoxy or the like, which is an aromatic compound of an organic compound having a benzene ring or a condensed ring thereof. The resin layer 20 is an energy cured resin (for example, a heat cured resin and a light cured resin).

As a modified example of the foregoing patterning step of the resin layer 20, for example, drop discharge method (for example, inkjet method) may be applied. According to the drop discharge method, a resin material can be directly discharged to an appropriate region. In particular, according to inkjet method, by applying a technology being in practical use for inkjet printers, the resin layer 20 can be provided speedy and economically without using needless ink (resin material).

3. After that, as shown in FIG. 6 and FIG. 7, a resin boss 40 is formed.

Figure 6:
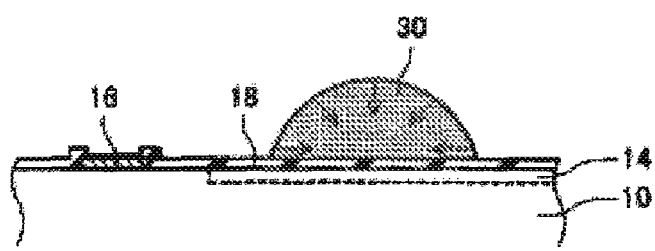
FIG. 6 is a view explaining the method for manufacturing a semiconductor device according to this embodiment.

First, as shown in FIG. 6, by a first energy supply processing (for example, heat processing and light illumination processing), a resin layer 30 is fused. In this case, the resin layer 30 is not cured and shrunk (crosslinking reaction). More particularly, the resin layer 30 is fused so that curing and shrinkage reaction of all or part of the resin layer 30 is not started. When a heat cured resin is used, heat processing is performed at temperatures and for time in which the resin is fused, the resin layer 30 is fused, and the surface is formed into a smooth curved surface. For example, when the cross section shape of the resin layer 20 after patterning is an approximate quadrangle, the cross section shape of the resin layer 30 after fusion can be formed in the shape of an approximate semicircle. The heating temperatures and heating time can be adjusted as appropriate according to the resin material.

Figure 7:
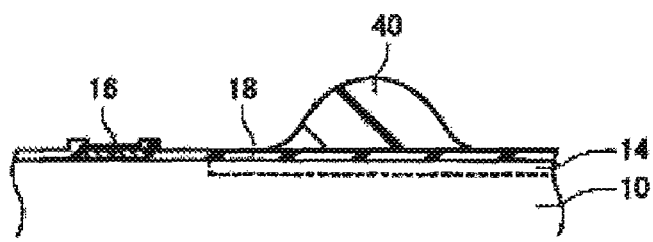
FIG. 7 is a view explaining the method for manufacturing a semiconductor device according to this embodiment.

After that, as shown in FIG. 7, by a second energy supply processing (for example, heat processing and light illumination processing), the resin layer 30 after fusion is cured and shrunk. When the cross section shape of the resin layer 30 after fusion is an approximate semicircle, by curing and shrinking the resin layer 30 (completing curing and shrinkage reaction) in this step, the resin boss 40 with a moderate rising section can be formed. When a heat cured resin is used, heat processing is performed at temperatures and for time in which the resin after fusion is cured and shrunk. In this case, the foregoing heating temperature in curing may be higher than the heating temperature in fusion. That is, the curing temperature of the resin material may be higher than the fusion temperature of the resin material. The curing temperature of the resin material may be adjusted as appropriate by changing an amount or constituents of additives (curing agent and crosslinking agent) added to the resin material. Further, the heating time in curing may be longer than the heating time in fusion. The first and the second energy supply processing may be performed in a series of steps.

As shown in FIG. 7, the surface of the resin boss 40 is a curved surface. The cross section of the resin boss 40 is in the shape of an approximate semicircle, for example. A rising angle of the resin boss 40 (angle made by a tangent line of an inclined plane in the vicinity of the rising section and the surface of the passivation film 18 (so-called contact angle)) θ is at least in the range of θ<90 deg (optimally in the range of >0deg). Further, the rising section of the resin boss 40 is formed in a curve so that a concave shape is made in the outward oblique direction (upward oblique direction).

Figure 8:
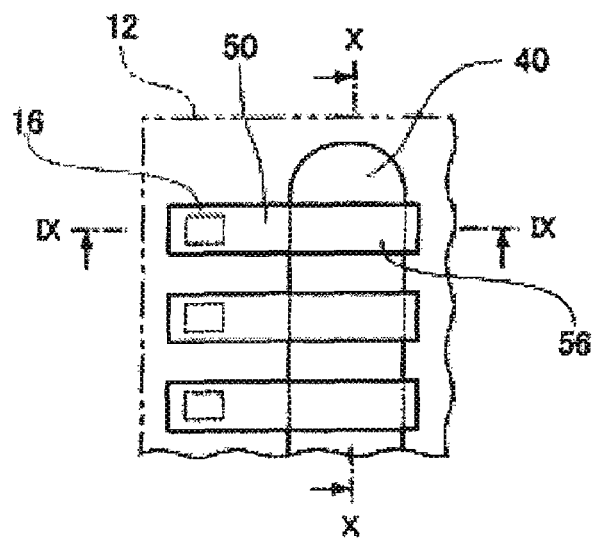
FIG. 8 is a view explaining the method for manufacturing a semiconductor device according to this embodiment.
Figure 9:
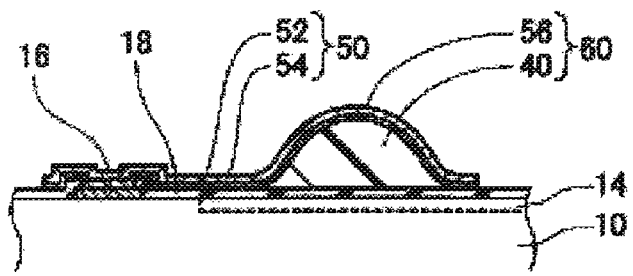
FIG. 9 is a cross section taken along line IX-IX of FIG. 8.
Figure 10:
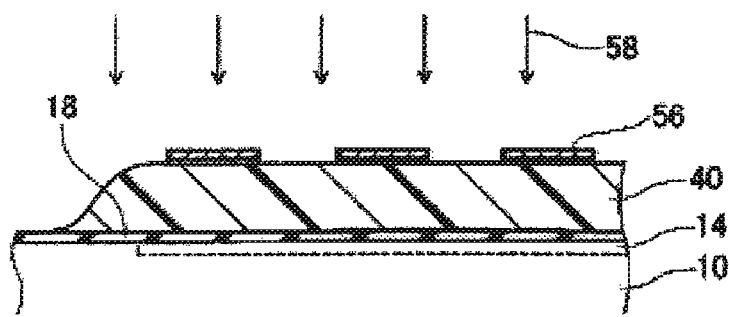
FIG. 10 is a cross section taken along line X-X of FIG. 8.

4. Next, as shown in FIG. 8 to FIG. 10, an electrical conducting layer 50 which is electrically connected to the electrode pad 16 and passes through over the resin boss 40 is formed. FIG. 8 is a partial plan view of the state after a step of forming the electrical conducting layer. FIG. 9 is a cross section taken along line IX-IX of FIG. 8. FIG. 10 is a cross section taken along line X-X of FIG. 8.

First, before the electrical conducting layer 50 is formed, the oxide layer 17 on the electrode pad 16 is removed. The oxide layer 17 is, for example. a layer grown by natural oxidation or grown by the foregoing step of curing the resin. As a method of removing the oxide layer 17, for example, contra-sputtering of Ar gas can be applied. When the contra-sputtering of Ar gas is performed on the whole face of the semiconductor substrate 10, carbonization of the surface of the resin boss 40 is thereby progressed. That is, a carbonized layer or a precursory layer of the carbonized layer (for example, plasma polymerization layer) is formed on the surface of the resin boss 40. This embodiment is particularly beneficial in the case that the carbonized layer or the like is formed as above.

The electrical conducting layer 50 can be formed by depositing an electrical conducting foil by sputtering method or vapor deposition method, and then patterning the electrical conducting foil. The electrical conducting layer 50 can be formed from a plurality of layers composed of a first layer (for example, TiW layer) 52 as a base and a second layer thereon (for example, Au layer) 54, for example. In this case, it is possible that the electrical conducting foil is formed from the first and the second layers 52 and 54, the second layer 54 is patterned by etching (for example, wet etching) by using a resist as a mask, and the first layer 52 is patterned by using the second layer 54 after patterning as a mask. The first layer 52 as a base can be utilized to prevent metal diffusion and improve contact characteristics, and can be utilized as a plated layer. As a modified example, it is possible that the first layer 52 as a base is formed by sputtering method or vapor deposition method, and the second layer 54 thereon is formed by electroless plating or electroplating. Thereby, the second layer 54 can be easily formed thicker. Otherwise, the electrical conducting layer 50 can be formed from a single layer (for example, Au layer). The material of the electrical conducting layer 50 is not limited to the foregoing, but, for example, Cu, Ni, Pd, Al, Cr or the like can be used as a material thereof.

The electrical conducting layer 50 is a wiring layer which electrically connects the electrode pad 16 to the resin boss 40. The electrical conducting layer 50 is formed to pass through over at least the electrode pad 16, the passivation film 18, and the resin boss 40. In this embodiment, since the rising section of the resin boss 40 is formed moderately, contact characteristics of the electrical conducting layer 50 can be improved. Therefore, the electrical conducting layer 50 can be prevented from being exfoliated and disconnected. In the example shown in FIG. 9, the electrical conducting layer 50 is formed to pass past the resin boss 40 to reach the passivation film 18 again. In other words, the electrical conducting layer 50 is formed to branch out in a plurality of directions (for example, opposite directions) from the resin boss 40 to reach the passivation film 18. Thereby, contact characteristics to the base of the electrical conducting layer 50 can be further improved. The electrical conducting layer 50 has an electrical connection section 56 formed on the resin boss 40.

Figure 11:
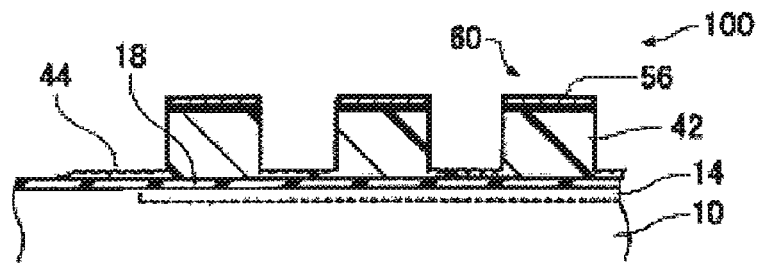
FIG. 11 is a view explaining the method for manufacturing a semiconductor device according to this embodiment.

As shown in FIG. 10 and FIG. 11, it is possible that after the electrical conducting layer 50 is formed, the resin boss 40 is partly removed by using the electrical conducting layer 50 as a mask. Thereby, for example, emission characteristics of an adhesive in mounting can be improved. For example, when the resin boss 40 is formed in the shape of a straight line with a given width, and the plurality of electrical connection sections 56 are arranged at given intervals in the longitudinal direction of the resin boss 40, a section exposed from between the adjacent electrical connection sections 56 is removed by etching with an anisotropic etchant (for example, $O_2$ plasma) 58. In this case, in order to prevent the passivation film 18 from being damaged, etching can be made so that a resin residual 44 is provided between the adjacent electrical connection sections 56. According to this embodiment, the rising section of the resin boss 40 is moderate. Therefore, the anisotropic etchant easily enters the root section of the resin boss 40. Thereby, the carbonized layer and the like formed in the root section of the resin boss 40 can be removed more easily than in the past. Consequently, migration resulting from the carbonized layer and the like can be prevented, and reliability can be improved.

In result, a semiconductor device 100 having a plurality of resin core bumps 60 can be manufactured. The resin core bump 60 is formed on one face of the semiconductor substrate 10 (face on which the integrated circuit 14 is formed). The resin core bump 60 includes a resin boss 42 and the electrical connection section 56 formed on the resin boss 42. Thereby, since the resin boss 42 becomes a core and has elasticity itself, a stress relaxation function and electrical connection reliability in mounting can be improved. The semiconductor device according to this embodiment has a structure derivable from the foregoing contents of the method for manufacturing a semiconductor device.

Electronic Equipment

Figure 12:
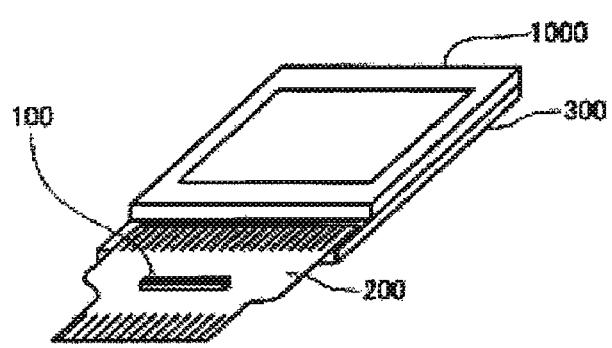
FIG. 12 is a view showing an electronic device according to this embodiment.

FIG. 12 is a view showing an electronic device according to the embodiment of the invention. An electrical device (for example, display device) 1000 includes the semiconductor device 100. In the example shown in FIG. 12, the electronic device 1000 includes the semiconductor device 100, a first substrate 200 made of a resin film or the like, and a second substrate 300 made of glass or the like. The semiconductor device 100 is mounted face-downward on the first substrate 200, for example. More specifically, a wiring pattern formed on the first substrate 200 is electrically connected to the resin core bump 60 of the semiconductor device 100. An unshown insulative adhesive (for example, NCF (Non Conductive Film) or NCP (Non Conductive Paste)) is provided between the semiconductor device 100 and the first substrate 200.

Figure 13:
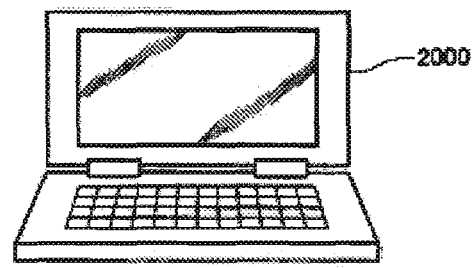
FIG. 13 is a view showing electronic equipment according to this embodiment.
Figure 14:
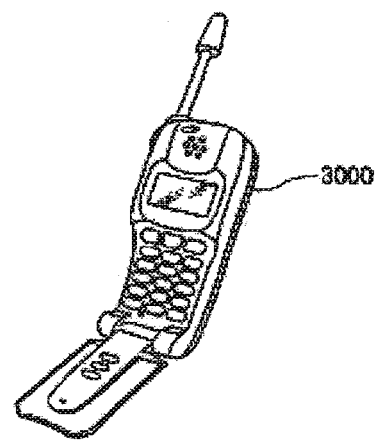
FIG. 14 is a view showing electronic equipment according to this embodiment.

Otherwise, it is possible that the first substrate 200 is omitted, and the semiconductor device 100 is mounted face-downward on the second substrate 300. As an example of the electron device 1000, for example, a liquid crystal display, a plasma display, an EL (Electrical Luminescence) display and the like can be cited. As an example of the electronic equipment according to the embodiment of the invention, a notebook-sized personal computer is shown in FIG. 13, and a mobile phone is shown in FIG. 14.

MODIFIED EXAMPLE

Figure 15:
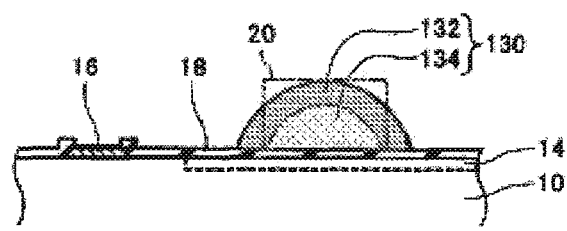
FIG. 15 is a view explaining a method for manufacturing a semiconductor device according to a modified example of this embodiment.

FIG. 15 is a view explaining a method for manufacturing a semiconductor device according to a modified example of the embodiment of the invention.

In this modified example, by the first energy supply processing, a resin layer 130 is fused so that fusion of a surface section 132 is progressed more than of a central section 134. For example, when a heat cured resin is used, heat processing is performed by hot air to fuse the surface section 132 of the resin layer 130. The heat processing by hot air can be performed in a reduced pressure than the ambient pressure. Further, in the resin layer 130, it is enough that fusion of the surface section 132 is progressed more than of the central section 134. It is possible that the surface section 132 and the central section 134 are fused concurrently. Otherwise, the resin layer 130 other than the central section 134, that is, only the surface section 132 may be fused. Further, it is enough that at least the surface section 132 of the resin layer 130 is progressed by the first energy supply processing. It is also possible that curing and shrinkage reaction of at least part of the surface section 132 is started concurrently with fusion. In this step, as shown in FIG. 15, the surface of the resin layer 130 can be formed into a smooth curved surface.

After that, by performing the second energy supply processing, the resin layer 130 after fusion is cured and shrunk. In this modified example, the surface of the resin layer 130 after fusion can be also formed into a smooth curved surface. Therefore, by curing and shrinking the resin layer 130 from such a shape, a resin boss with a moderate rising section can be formed.

Figure 16:
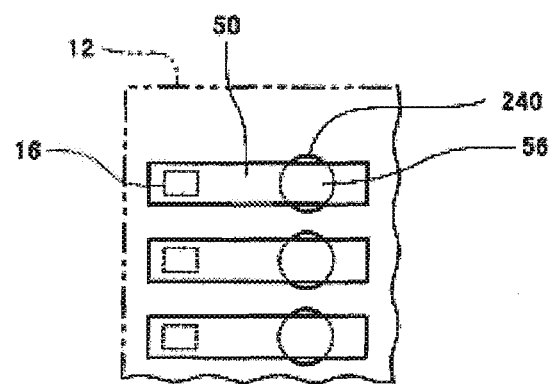
FIG. 16 is a view explaining a method for manufacturing a semiconductor device according to a modified example of this embodiment.

FIG. 16 is a view explaining a method for manufacturing a semiconductor device according to other modified example of the embodiment of the invention. In this modified example, the mode of a resin boss 240 is different from the foregoing.

For details of patterning of a resin layer, the foregoing contents can be applied. However, in this modified example, before the step of forming the electrical conducting layer 50, the plurality of resin bosses 240 are formed separately from each other so that one of the resin bosses 240 corresponds to one of the electrode pads 16. Thereby, for example, after patterning the resin layer in the shape of a plurality of columns individually, the approximate semicircle resin boss 240 can be formed by performing the first and the second energy supply processing. The details thereof are as described above.

For example, the electrical conducting layer 50 electrically connects one electrode pad 16 to one resin boss 240. In this case, the electrical conducting layer 50 may be formed to cover only part of one resin boss 240, or can be formed to cover the whole thereof. In the former case, part of the resin boss 240 is exposed, and therefore external force is opened. In result, the electrical connection section 56 (electrical conducting layer 50) can be prevented from being cracked in mounting.

In this modified example, the resin boss 240 is formed separately from each other previously. Therefore, the step of partly removing the resin boss after forming the electrical conducting layer 50 as in the foregoing example can be omitted.

The invention is not limited to the foregoing embodiment, and various modifications may be made. For example, the invention includes structures which are substantially identical with the structure explained in the embodiment (for example, structures which are substantially identical with the structure explained in the embodiment in terms of the function, the method, and the result, or structures which are substantially identical with the structure explained in the embodiment in terms of the purpose and the result). Further, the invention includes structures, in which a part unessential for the structure explained in the embodiment is substituted. Further, the invention includes structures providing the operation and the effect which are identical with of the structure explained in the embodiment, or structures capable of attaining the purpose identical with of the structure explained in the embodiment. Further, the invention includes structures in which a well known art is added to the structure explained in the embodiment.

What is claimed is:

1. A method for manufacturing a semiconductor device, comprising:
 (a) forming an energy cured resin layer on a semiconductor substrate having an electrode pad and a passivation film;
 (b) forming a curved surface of the energy cured resin layer by fusing the energy cured resin layer by a first energy supply processing without removing or curing any of the energy cured resin layer,
 (c) forming a resin boss by curing and shrinking the energy cured resin layer after fusion by a second energy supply processing; and
 (d) forming an electrical conducting layer which is electrically connected to the electrode pad, and is disposed over the resin boss, and is in contact with the passivation film.

2. The method for manufacturing a semiconductor device according to claim 1, wherein both the first energy supply processing and the second energy supply processing are heat processing, and
 the heating temperature in the forming of the resin boss by curing and shrinking the resin layer after fusion by the second energy supply processing is higher than the heating temperature in the fusing of the energy cured resin layer without being cured and shrunk by the first energy supply processing.

3. The method for manufacturing a semiconductor device according to claim 1, wherein the energy cured resin layer is formed in the shape of an approximate quadrangle on cross section by the forming of the energy cured resin layer on the semiconductor substrate having the electrode pad and the passivation film, and
 the resin layer is formed in the shape of an approximate semicircle on cross section by the fusing of the resin layer without being cured and shrunk by the first energy supply processing.

4. The method for manufacturing a semiconductor device according to claim 1, wherein, in the forming of the electrical conducting layer, an oxide film is removed from the surface of the electrode pad and carbonization of the surface of the resin boss is progressed by Ar gas before forming the electrical conducting layer, and
 the resin boss is partly removed by using the electrical conducting layer as a mask after the forming of the electrical conducting layer.

5. The method for manufacturing a semiconductor device according to claim 1, wherein forming the energy cured resin layer on the semiconductor substrate having the electrode pad and the passivation film, the energy cured resin layer is selectively deposited in a location separate from the electrode pad.

6. A method for manufacturing a semiconductor device, comprising:
   (a) forming an energy cured resin layer on a semiconductor substrate having an electrode pad and a passivation film;
   (b) forming the energy cured resin layer to have a cross section formed in the shape of an approximate semicircle by fusing the energy cured resin layer by a first energy supply processing without removing or curing any of the energy cured resin layer;
   (c) forming a resin boss by curing and shrinking the energy cured resin layer after fusion by a second energy supply processing; and
   (d) forming an electrical conducting layer which is electrically connected to the electrode pad, and is disposed over the resin boss, and is in contact with the passivation film.

* * * * *